US 6,623,279 B2

(12) United States Patent
Derian et al.

(10) Patent No.: US 6,623,279 B2
(45) Date of Patent: Sep. 23, 2003

(54) SEPARABLE POWER DELIVERY CONNECTOR

(75) Inventors: Edward J. Derian, San Diego, CA (US); Joseph Ted DiBene, II, Oceanside, CA (US); David H. Hartke, Durango, CO (US)

(73) Assignee: Incep Technologies, Inc., San Diego, CA (US)

( * ) Notice: Subject to any disclaimer, the term of this patent is extended or adjusted under 35 U.S.C. 154(b) by 0 days.

(21) Appl. No.: 10/132,586

(22) Filed: Apr. 25, 2002

(65) Prior Publication Data

US 2002/0176229 A1 Nov. 28, 2002

Related U.S. Application Data

(63) Continuation-in-part of application No. 09/932,878, filed on Aug. 20, 2001, and a continuation-in-part of application No.

(List continued on next page.)

(60) Provisional application No. 60/361,554, filed on Mar. 4, 2002, provisional application No. 60/359,504, filed on Feb. 25, 2002, provisional application No. 60/338,004, filed on Nov. 8, 2001, provisional application No. 60/313,338, filed on Aug. 17, 2001, provisional application No. 60/310,038, filed on Aug. 3, 2001, provisional application No. 60/304,930, filed on Jul. 11, 2001, provisional application No. 60/304,929, filed on Jul. 11, 2001, provisional application No. 60/301,753, filed on Jun. 27, 2001, provisional application No. 60/299,573, filed on Jun. 19, 2001, provisional application No. 60/292,125, filed on May 18, 2001, provisional application No. 60/291,772, filed on May 16, 2001, provisional application No. 60/291,749, filed on May 16, 2001, provisional application No. 60/287,860, filed on May 1, 2001, provisional application No. 60/266,941, filed on Feb. 6, 2001, provisional application No. 60/251,184, filed on Dec. 4, 2000, provisional application No. 60/251,223, filed on Dec. 4, 2000, provisional application No. 60/251,222, filed on Dec. 4, 2000, provisional application No. 60/232,971, filed on Sep. 14, 2000, provisional application No. 60/222,407, filed on Aug. 2, 2000, provisional application No. 60/222,386, filed on Aug. 2, 2000, provisional application No. 60/219,813, filed on Jul. 21, 2000, provisional application No. 60/219,506, filed on Jul. 20, 2000, provisional application No. 60/196,059, filed on Apr. 10, 2000, provisional application No. 60/187,777, filed on Mar. 8, 2000, provisional application No. 60/183,474, filed on Feb. 18, 2000, provisional application No. 60/171,065, filed on Dec. 16, 1999, and provisional application No. 60/167,792, filed on Nov. 29, 1999.

(51) Int. Cl.$^7$ ............................................. H01R 12/00
(52) U.S. Cl. ..................................... 439/74; 361/799
(58) Field of Search ..................... 439/66, 74; 361/758, 361/799, 804, 784, 785; 174/51, 138 G

(56) References Cited

U.S. PATENT DOCUMENTS 4,358,503 A 11/1982 Homeyer (List continued on next page.)

FOREIGN PATENT DOCUMENTS

EP 0 582 145 A1 2/1994

(List continued on next page.)

OTHER PUBLICATIONS

Chung, "Ball–Grid–Array Package Thermal Management," 14$^{th}$ IEEE Semi–Therm™ Symposium, 1998, 78–87.

(List continued on next page.)

Primary Examiner—Lynn Feild
Assistant Examiner—Thanh-Tam Le
(74) Attorney, Agent, or Firm—Knobbe Martens Olson & Bear LLP

(57) ABSTRACT

A connector for providing power from a first circuit board to a second circuit board. The apparatus comprises a first conductive member, including a first conductive member first end and a first conductive member second end distal from the first end; a second conductive member disposed within the first conductive member, the second conductive member including a second conductor member first end and a second conductor member second end distal from the second conductor member first end; and one or more first circuit board permanent attachment features for electrical coupling with the first circuit board and second circuit board, and one or more disconnectable conduction features for electrically coupling the connector with the second circuit board.

63 Claims, 7 Drawing Sheets

Related U.S. Application Data

(63) 09/885,780, filed on Jun. 19, 2001, now abandoned, and a continuation-in-part of application No. 09/785,829, filed on Feb. 16, 2001, now Pat. No. 6,452,113, and a continuation-in-part of application No. 09/727,016, filed on Nov. 28, 2000, now abandoned, and a continuation-in-part of application No. 09/353,428, filed on Jul. 15, 1999, now Pat. No. 6,304,450, application No. 10/132,586, which is a continuation-in-part of application No. 09/798,541, filed on Mar. 2, 2001, now abandoned, and a continuation-in-part of application No. 09/785,892, filed on Feb. 16, 2001, now Pat. No. 6,452,113, and a continuation-in-part of application No. 09/432,878, filed on Nov. 2, 1999, now Pat. No. 6,356,448, which is a continuation-in-part of application No. 09/353,428, filed on Jul. 15, 1999, now Pat. No. 6,304,450, application No. 10/132,586, which is a continuation-in-part of application No. 09/802,329, filed on Mar. 8, 2001, and a continuation-in-part of application No. 09/798,541, and a continuation-in-part of application No. 09/785,892, and a continuation-in-part of application No. 09/727,016, and a continuation-in-part of application No. 09/432,878, application No. 10/132,586, which is a continuation-in-part of application No. 09/910,524, filed on Jul. 20, 2001, now abandoned, which is a continuation-in-part of application No. 09/801,437, filed on Mar. 8, 2001, and a continuation-in-part of application No. 09/801,329, and a continuation-in-part of application No. 09/798,541, and a continuation-in-part of application No. 09/785,892, and a continuation-in-part of application No. 09/727,016, and a continuation-in-part of application No. 09/432,878, application No. 10/132,586, which is a continuation-in-part of application No. 09/818,173, filed on Mar. 26, 2001, now abandoned, which is a continuation-in-part of application No. 09/802,329, and a continuation-in-part of application No. 09/798,541, and a continuation-in-part of application No. 09/727,016, and a continuation-in-part of application No. 09/432,878, application No. 10/132,586, which is a continuation-in-part of application No. 09/921,153, filed on Aug. 2, 2001, now Pat. No. 6,490,160, which is a continuation-in-part of application No. 09/921,152, filed on Aug. 2, 2001, and a continuation-in-part of application No. 09/910,524, and a continuation-in-part of application No. 09/802,329, and a continuation-in-part of application No. 09/798,541, and a continuation-in-part of application No. 09/785,892, and a continuation-in-part of application No. 09/727,016, and a continuation-in-part of application No. 09/432,878, application No. 10/132,586, which is a continuation-in-part of application No. 09/921,152, filed on Aug. 2, 2001, which is a continuation-in-part of application No. 09/921,153, and a continuation-in-part of application No. 09/910,524, and a continuation-in-part of application No. 09/801,437, and a continuation-in-part of application No. 09/802,329, and a continuation-in-part of application No. 09/798,541, and a continuation-in-part of application No. 09/785,892, and a continuation-in-part of application No. 09/727,016, and a continuation-in-part of application No. 09/432,878, application No. 10/132,586, which is a continuation-in-part of application No. 10/022,454, filed on Oct. 30, 2001, now Pat. No. 6,556,455, which is a continuation-in-part of application No. 09/921,152, and a continuation-in-part of application No. 09/921,153, and a continuation-in-part of application No. 09/910,524, and a continuation-in-part of application No. 09/885,780, and a continuation-in-part of application No. 09/818,173, and a continuation-in-part of application No. 09/801,437, and a continuation-in-part of application No. 09/802,329, and a continuation-in-part of application No. 09/798,541, and a continuation-in-part of application No. 09/785,892, and a continuation-in-part of application No. 09/727,016, and a continuation-in-part of application No. 09/432,878, application No. 10/132,586, which is a continuation-in-part of application No. 10/036,957, filed on Dec. 20, 2001, which is a continuation-in-part of application No. 10/022,454, and a continuation-in-part of application No. 09/921,152, and a continuation-in-part of application No. 09/921,153, and a continuation-in-part of application No. 09/910,524, and a continuation-in-part of application No. 09/885,780, and a continuation-in-part of application No. 09/818,173, and a continuation-in-part of application No. 09/801,437, and a continuation-in-part of application No. 09/802,329, and a continuation-in-part of application No. 09/798,541, and a continuation-in-part of application No. 09/785,892, and a continuation-in-part of application No. 09/727,016, and a continuation-in-part of application No. 09/432,878.

U.S. PATENT DOCUMENTS

| Patent No. | | Date | Inventor |
|---|---|---|---|
| 4,446,173 A | | 5/1984 | Barrell et al. |
| 4,498,530 A | | 2/1985 | Lipschutz |
| 4,521,829 A | | 6/1985 | Wessely |
| 4,589,057 A | | 5/1986 | Short |
| 4,724,901 A | | 2/1988 | Munekawa |
| 4,742,385 A | | 5/1988 | Kohmoto |
| 4,760,495 A | | 7/1988 | Till |
| 4,771,365 A | | 9/1988 | Cichocki et al. |
| 4,875,140 A | * | 10/1989 | Delpech et al. ............. 361/789 |
| 4,942,497 A | | 7/1990 | Mine et al. |
| 4,974,119 A | | 11/1990 | Martin |
| 4,982,311 A | | 1/1991 | Dehaine et al. |
| 5,052,481 A | | 10/1991 | Horvath et al. |
| 5,065,280 A | | 11/1991 | Karnezos et al. |
| 5,161,089 A | | 11/1992 | Chu et al. |
| 5,194,480 A | | 3/1993 | Block et al. |
| 5,195,020 A | | 3/1993 | Suzuki et al. |
| 5,198,889 A | | 3/1993 | Hisano et al. |
| 5,216,580 A | | 6/1993 | Davidson et al. |
| 5,258,887 A | | 11/1993 | Fortune |
| 5,272,599 A | | 12/1993 | Koenen |
| 5,312,508 A | | 5/1994 | Chisolm |
| 5,315,069 A | | 5/1994 | Gebara |
| 5,331,510 A | | 7/1994 | Ouchi et al. |
| 5,343,358 A | | 8/1994 | Hilbrink |
| 5,345,366 A | * | 9/1994 | Cheng et al. ............... 361/785 |
| 5,365,402 A | | 11/1994 | Hatada et al. |
| 5,380,211 A | | 1/1995 | Kawaguchi et al. |
| 5,386,143 A | | 1/1995 | Fitch |
| 5,390,078 A | | 2/1995 | Taylor |
| 5,396,403 A | | 3/1995 | Patel |
| 5,409,055 A | | 4/1995 | Tanaka et al. |
| 5,467,251 A | | 11/1995 | Katchmar |
| 5,473,510 A | | 12/1995 | Dozier, II |
| 5,504,924 A | | 4/1996 | Ohashi et al. |
| 5,510,958 A | | 4/1996 | Shimabara et al. |
| 5,515,912 A | | 5/1996 | Daikoku et al. |
| 5,520,976 A | | 5/1996 | Giannetti et al. |
| 5,544,017 A | | 8/1996 | Beilin et al. |
| 5,545,473 A | | 8/1996 | Ameen et al. |
| 5,586,011 A | | 12/1996 | Alexander |
| 5,591,034 A | | 1/1997 | Ameen et al. |
| 5,608,610 A | | 3/1997 | Brzezinski |
| 5,619,399 A | | 4/1997 | Mok |
| 5,621,615 A | | 4/1997 | Dawson et al. |
| 5,646,826 A | | 7/1997 | Katchmar |
| 5,647,430 A | | 7/1997 | Tajima |
| 5,661,902 A | | 9/1997 | Katchmar |
| 5,704,416 A | | 1/1998 | Larson et al. |
| 5,708,566 A | | 1/1998 | Hunninghaus et al. |
| 5,721,454 A | | 2/1998 | Palmer |
| 5,729,433 A | | 3/1998 | Mok |
| 5,734,555 A | | 3/1998 | McMahon |
| 5,738,936 A | | 4/1998 | Hanrahan |
| 5,754,412 A | * | 5/1998 | Clavin ........................ 361/804 |
| 5,761,043 A | | 6/1998 | Salmonson |
| 5,783,316 A | | 7/1998 | Colella et al. |
| 5,786,075 A | | 7/1998 | Mishuku et al. |
| 5,794,454 A | | 8/1998 | Harris et al. |
| 5,796,582 A | | 8/1998 | Katchmar |
| 5,800,905 A | | 9/1998 | Sheridan et al. |
| 5,801,924 A | | 9/1998 | Salmonson |
| 5,815,921 A | | 10/1998 | Burward-Hoy |

| | | | |
|---|---|---|---|
| 5,825,630 A | 10/1998 | Taylor et al. | |
| 5,825,633 A | 10/1998 | Bujalski et al. | |
| 5,842,514 A | 12/1998 | Zapach et al. | |
| 5,856,911 A | 1/1999 | Riley | |
| 5,864,478 A | 1/1999 | McCutchan et al. | |
| 5,898,573 A | 4/1999 | Fugaro | |
| 5,904,796 A | 5/1999 | Freuler et al. | |
| 5,905,638 A | 5/1999 | MacDonald, Jr. et al. | |
| 5,920,458 A | 7/1999 | Azar | |
| 5,930,115 A | 7/1999 | Tracy et al. | |
| 5,945,217 A | 8/1999 | Hanrahan | |
| 5,956,835 A * | 9/1999 | Aksu | 29/468 |
| 5,966,294 A | 10/1999 | Harada et al. | |
| 5,980,267 A | 11/1999 | Ayers et al. | |
| 5,981,869 A | 11/1999 | Kroger | |
| 5,986,887 A | 11/1999 | Smith et al. | |
| 5,995,370 A | 11/1999 | Nakamori | |
| 6,014,313 A | 1/2000 | Hesselbom | |
| 6,018,465 A | 1/2000 | Borkar et al. | |
| 6,031,727 A | 2/2000 | Duesman et al. | |
| 6,037,659 A | 3/2000 | Weixel | |
| 6,062,302 A | 5/2000 | Davis et al. | |
| 6,092,281 A | 7/2000 | Glenn | |
| 6,096,414 A | 8/2000 | Young | |
| 6,131,646 A | 10/2000 | Kelley | |
| 6,137,693 A | 10/2000 | Schwiebert et al. | |
| 6,157,544 A | 12/2000 | Ferling et al. | |
| 6,191,475 B1 | 2/2001 | Skinner et al. | |
| 6,222,265 B1 | 4/2001 | Akram et al. | |
| 6,225,566 B1 | 5/2001 | Dienst | |
| 6,231,352 B1 | 5/2001 | Gonzales | |
| 6,262,887 B1 * | 7/2001 | Lee | 361/683 |
| 6,265,672 B1 | 7/2001 | Eum et al. | |
| 6,297,551 B1 | 10/2001 | Dudderar et al. | |
| 6,304,450 B1 | 10/2001 | DiBene, II et al. | |
| 6,347,044 B1 * | 2/2002 | Won et al. | 361/807 |
| 6,356,448 B1 | 3/2002 | DiBene, II et al. | |
| 6,390,829 B1 * | 5/2002 | Rademacher | 439/74 |
| 6,399,887 B1 * | 6/2002 | Lin | 174/138 D |
| 6,493,233 B1 * | 12/2002 | De Lorenzo et al. | 361/752 |

FOREIGN PATENT DOCUMENTS

| | | |
|---|---|---|
| EP | 0 717 443 A1 | 6/1996 |
| EP | 0 910 235 A1 | 4/1999 |
| EP | 0 920 055 A2 | 6/1999 |
| FR | 2 722 334 A1 | 1/1996 |
| JP | 57066654 | 4/1982 |
| JP | 58175851 | 10/1983 |
| JP | 1174427 A2 | 7/1989 |
| JP | 03041753 | 2/1991 |
| JP | 08204304 | 8/1996 |
| JP | 08330699 | 12/1996 |
| WO | WO 96/23397 | 8/1996 |
| WO | WO 01/06821 A1 | 1/2001 |
| WO | PCT/US 00/29452 | 3/2001 |
| WO | WO 01/33927 A1 | 5/2001 |

OTHER PUBLICATIONS

AI Technology, Inc., "Cool–Gel," Product Data Sheet, Nov. 1999, 7pp.

XP000124263, IBM Tech Disc Bulletin, "Multiple Electronic Board . . . System," 1994, 33(3B):55–56.

IBM Corp. Technical Disclosure Bulletin, "Pin Fin Array Heat Pipe Apparatus," Sep. 1994, vol. 37, No. 9, 1pp.

* cited by examiner

Section A-A

Section A-A

SEPARABLE POWER DELIVERY CONNECTOR

CROSS-REFERENCE TO RELATED APPLICATIONS

This application claims benefit of the following provisional patent applications, which are hereby incorporated by reference herein:

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, Farhad Raiszadeh, filed May 18, 2001;

Application Ser. No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO-I-PAK," by Joseph T. DiBene II, Carl E. Hoge, David H. Hartke, and Edward J. Derian, filed Jul. 11, 2001;

Application Ser. No. 60/310,038, entitled "TOOL-LESS CONCEPTS FOR BORREGO," by Edward J. Derian and Joseph T. DiBene II, filed Aug. 3, 2001;

Application Ser. No. 60/313,338, entitled "TOOL-LESS PRISM IPA ASSEMBLY TO SUPPORT IA64 MCKINLEY MICROPROCESSOR," by David H. Hartke and Edward J. Derian, filed Aug. 17, 2001;

Application Ser. No. 60/338,004, entitled "MICRO-SPRING CONFIGURATIONS FOR POWER DELIVERY FROM VOLTAGE REGULATOR MODULES TO INTEGRATED CIRCUITS AND MICROPROCESSORS," by Joseph T. DiBene II, David H. Hartke, Carl E. Hoge, and Edward J. Derian, filed Nov. 8, 2001;

Application Ser. No. 60/361,554, entitled "RIGHT ANGLE POWER CONNECTOR ARCHITECTURE," by David H. Hartke, filed Mar. 4, 2002; and Application Ser. No. 60/359,504, entitled "HIGH EFFICIENCY VRM CIRCUIT CONSTRUCTIONS FOR LOW VOLTAGE, HIGH CURRENT ELECTRONIC DEVICES," by Philip M. Harris, filed Feb. 25, 2002, This patent application is also continuation-in-part of the following and commonly assigned patent applications, each of which applications are hereby incorporated by reference herein:

Application Ser. No. 09/885,780, entitled "INTER-CIRCUIT ENCAPSULATED PACKAGING," by Joseph T. DiBene II and David H. Hartke, filed Jun. 19, 2001 now abandoned, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application No. Ser. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, which claims priority to the following U.S. Provisional Patent Applications:

Application Ser. No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

Application Ser. No. 60/171,065, entitled "INTER-CIRCUIT ENCAPSULATED PACKAGING TECHNOLOGY," by Joseph T. DiBene II and David H. Hartke, filed Dec. 16, 1999;

Application Ser. No. 60/183,474, entitled "DIRECT ATTACH POWER/THERMAL WITH INCEP," by Joseph T. DiBene II and David H. Hartke, filed Feb. 18, 2000;

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001, which claims priority to the following Provisional Patent Applications;

Application Ser. No. 60/183,474, entitled "DIRECT ATTACH POWER/THERMAL WITH INCEP," by Joseph T. DiBene II and David H. Hartke, filed Feb. 18, 2000;

Application Ser. No. 60/186,769, entitled "THERMACEP SPRING BEAM," by Joseph T. DiBene II and David H. Hartke, filed Mar. 3, 2000;

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEAT SINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene James J. Hjerpe, filed Sept. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, Joseph T. DiBene II, filed Feb. 6, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of Application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application No. Ser. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/183,474, entitled "DIRECT ATTACH POWER/THERMAL WITH INCEP," by Joseph T. DiBene II and David H. Hartke, filed Feb. 18, 2000;

Application Ser. No. 60/186,769, entitled "THERMACEP SPRING BEAM," by Joseph T. DiBene II and David H. Hartke, filed Mar. 3, 2000;

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIV- ERY IN 'INCEP' INTEGRATED ARCHITECTURE," by David H. Hartke, James M. Broder, Joseph T. DiBene II, filed Feb. 6, 2001;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, which is a continuation in part of the following patent applications:

Application Ser. No. 09/798,541, entitled "THERMAL/ MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, which is a continuation in part of the following patent applications:

Application Ser. No. 09/798,541, entitled "THERMAL/ MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000;

Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene II, David H. Hartke, Wendell C. Johnson, Farhad Raiszadeh, Edward J. Darien and Jose B. San Andres, filed Jul. 20, 2001, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, which claims priority to the following U.S. Provisional Patent Applications;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/219,506, entitled "HIGH PERFORMANCE THERMAL MECHANICAL INTERFACE," by Wendell C. Johnson, David H. Hartke and Joseph T. DiBene II, filed Jul. 20, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sept. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000;

Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001;

Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;and Application Ser. No. 60/304,930, entitled "MICRO I-PAK," by Joseph T. DiBene II, Carl E. Hoge, David H. Hartke, Edward J. Derian, filed Jul. 11, 2001;

Application Ser. No. 09/818,173, entitled "INTER-CIRCUIT ENCAPSULATED PACKAGING," by David H. Hartke and Joseph T. DiBene II, filed Mar. 26, 2001, which is a continuation in part of the following patent applications:

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND A SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO I-PAK," by Joseph T. DiBene II, Carl E. Hoge, David H. Hartke, Edward J. Derian, filed Jul. 11, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001, which is a continuation in part of the following patent applications:

Application Ser. No. 09/921,152, entitled "HIGH SPEED AND HIGH DENSITY CIRCULAR CONNECTOR FOR BOARD-TO-BOARD INTERCONNECT SYSTEMS," by David H. Hartke and Joseph T. DiBene II, filed Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450, and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEAT-SINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001; and Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001; and Application Ser. No. 60/304,930, entitled "MICRO I-PAK," by Joseph T. DiBene II, Carl E. Hoge, David H. Hartke, Edward J. Derian, filed Jul. 11, 2001;

Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001, which is a continuation in part of the following patent applications:

Application Ser. No. 09/921,153 entitled "VAPOR CHAMBER WITH INTEGRATED PIN ARRAY", by Joseph T. DiBene, II and Farhad Raiszadeh, filed on Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16,2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450; and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000;

Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, Joseph T. DiBene II, filed Feb. 6, 2001;

Application Ser. No. 60/277,369, entitled "THERMAL-MECHANICAL MEASUREMENT AND ANALYSIS OF AN ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEAT SINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001; and Application Ser. No. 60/304,930, entitled "MICRO I-PAK," by Joseph T. DiBene II, Carl E. Hoge, David H. Hartke, Edward J. Derian, filed Jul. 11, 2001;

Application Ser. No. 10/022,454, entitled "ULTRA LOW IMPEDANCE POWER INTERCONNECTION SYSTEM FOR ELECTRONIC PACKAGING," by Joseph T. DiBene II, David H. Hartke, Carl E. Hoge, and Edward J. Derian, filed Oct. 30, 2001, which is a continuation in part of the following U.S. Patent Applications:

Application Ser. No. 09/818, 173, entitled "INTER-CIRCUIT ENCAPSULATED PACKAGING," by Joseph T. DiBene, II and David H. Hartke, filed Mar. 26, 2001;

Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001;

Application Ser. No. 09/885,780, entitled "INTER-CIRCUIT ENCAPSULATED PACKAGING," by Joseph T. DiBene II and David H. Hartke, filed Jun. 19, 2001, which is a continuation of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/ MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450; and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000;

Application Ser. No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, Joseph T. DiBene II, filed Feb. 6, 2001;

Application Ser. No. 60/277,369, entitled "THERMAL-MECHANICAL MEASUREMENT AND ANALYSIS OF ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO I-PAK," by Joseph T. DiBene II, Carl E. Hoge, David H. Hartke, Edward J. Derian, filed Jul. 11, 2001; and Application Ser. No. 60/310,038, entitled "TOOL-LESS CONCEPTS FOR BORREGO," by Edward J. Derian and Joseph T. DiBene II, filed Aug. 3, 2001;

Application Ser. No. 60/313,338, entitled "TOOL-LESS PRISM IPA ASSEMBLY TO SUPPORT IA64 MCKINLEY MICROPROCESSOR," by David H. Hartke and Edward J. Derian, filed Aug. 17, 2001; and Application Ser. No. 60/338,004, entitled "MICRO-SPRING CONFIGURATIONS FOR POWER DELIVERY FROM VOLTAGE REGULATOR MODULES TO INTEGRATED CIRCUITS AND MICROPROCESSORS," by Joseph T. DiBene II, David H. Hartke, Carl E. Hoge, and Edward J. Derian, filed Nov. 8, 2001;

Application Ser. No. 10/036,957, entitled "ULTRA-LOW IMPEDANCE POWER INTERCONNECTION SYSTEM FOR ELECTRONIC PACKAGES," by Joseph T. DiBene II, David H. Hartke, Carl E. Hoge, and Edward J. Derian, filed Dec. 20, 2001, which is a continuation-in-part of the following patent Applications:

Application Ser. No. 10/022,454, entitled "ULTRA LOW IMPEDANCE POWER INTERCONNECTION SYSTEM FOR ELECTRONIC PACKAGING," by Joseph T. DiBene II, David H. Hartke, Carl E. Hoge, and Edward J. Derian, filed Oct. 30, 2001;

Application Ser. No. 09/818,173, entitled "INTER-CIRCUIT ENCAPSULATED PACKAGING," by Joseph T. DiBene, II and David H. Hartke, filed Mar. 26, 2001;

Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001;

Application Ser. No. 09/921,153 entitled "VAPOR CHAMBER WITH INTEGRATED PIN ARRAY", by Joseph T. DiBene, II and Farhad Raiszadeh, filed on Aug. 2, 2001;

Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001;

Application Ser. No. 09/885,780, entitled "INTER-CIRCUIT ENCAPSULATED PACKAGING," by Joseph T. DiBene II and David H. Hartke, filed Jun. 19, 2001, which is a continuation of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001;

Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001;

Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, which is a continuation-in-part of application Ser. No. 09/727,016, entitled "EMI CONTAINMENT USING INTER-CIRCUIT ENCAPSULATED PACKAGING TECHNOLOGY," by Joseph T. DiBene II and David H. Hartke, filed Nov. 28, 2000, and a continuation-in-part of application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 16, 2001, and a continuation in part of application Ser. No. 09/432,878, entitled "INTER-CIRCUIT ENCAPSULATED PACKAGING FOR POWER DELIVERY", by Joseph T. DiBene II and David H. Hartke, filed Nov. 2, 1999, which is a continuation in part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450;

Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, which is a continuation-in-part of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. Ser. No. 6,304,450; and which claims priority to the following U.S. Provisional Patent Applications:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGH AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH-CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Ser. No. 60/232,971, entitled "INTEGRATED POWER DISTRIBUTION AND SEMICONDUCTOR PACKAGE," by Joseph T. DiBene II, James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000;

Application Ser. No. 60/266,941, entitled "MECHANICAL INTERCONNECTION TECHNOLOGIES USING FLEX CABLE INTERCONNECT FOR DELIVERY IN 'INCEP' INTEGRATED ARCHITECTURE," by David H. Hartke, James M. Broder, Joseph T. DiBene II, filed Feb. 6, 2001;

Application Ser. No. 60/277,369, entitled "THERMAL-MECHANICAL MEASUREMENT AND ANALYSIS OF ADVANCED THERMAL INTERFACE MATERIAL CONSTRUCTION," by Farhad Raiszadeh and Edward J. Derian, filed Mar. 19, 2001;

Application Ser. No. 60/287,860, entitled "POWER TRANSMISSION DEVICE," by Joseph T. DiBene II, David H. Hartke, Carl E. Hoge, and Edward J. Derian, filed May 1, 2001;

Application Ser. No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Ser. No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001;

Application Ser. No. 60/299,573, entitled "MICRO I-PAK STACK UP ARCHITECTURE," by Joseph T. DiBene II, Carl E. Hoge, and David H. Hartke, filed Jun. 19, 2001;

Application Ser. No. 60/301,753, entitled "INTEGRATED POWER DELIVERY USING HIGH PERFOR- MANCE LINEAR REGULATORS ON PACKAGE WITH A MICROPROCESSOR," by Joseph T. DiBene II, Carl E. Hoge, and David H. Hartke, filed Jun. 27, 2001;

Application Ser. No. 60/304,929, entitled "BORREGO ARCHITECTURE," by David H. Hartke and Joseph T. DiBene II, filed Jul. 11, 2001;

Application Ser. No. 60/304,930, entitled "MICRO I-PAK," by Joseph T. DiBene II, Carl E. Hoge, David H. Hartke, Edward J. Derian, filed Jul. 11, 2001;

Application Ser. No. 60/310,038, entitled "TOOL-LESS CONCEPTS FOR BORREGO," by Edward J. Derian and Joseph T. DiBene II, filed Aug. 3, 2001;

Application Ser. No. 60/313,338, entitled "TOOL-LESS PRISM IPA ASSEMBLY TO SUPPORT IA64 MCKINLEY MICROPROCESSOR," by David H. Hartke and Edward J. Derian, filed Aug. 17, 2001; and Application Ser. No. 60/338,004, entitled "MICRO-SPRING CONFIGURATIONS FOR POWER DELIVERY FROM VOLTAGE REGULATOR MODULES TO INTEGRATED CIRCUITS AND MICROPROCESSORS," by Joseph T. DiBene II, David H. Hartke, Carl E. Hoge, and Edward J. Derian, filed Nov. 8, 2001.

BACKGROUND OF THE INVENTION

1. Field of the Invention

This invention relates in general to power distribution delivered to high performance circuits, and in particular to a system and method for distributing power to one or more circuit boards while providing for improved packaging.

2. Description of the Related Art

As electronic circuits become more complex, packaging of the circuitry has become more difficult. The common method for packaging integrated circuits (ICs) and other electronic components is to mount them on printed circuit boards (PCBs) or other substrates such as ceramic or organic consisting of alternating conductive and non-conductive layers or planes sandwiched or bonded together to form a dense X-Y signal interconnect. For a number of years, the operating voltage of ICs was approximately 5 volts and the power consumption was generally less than 1 watt. This relatively high supply voltage and low power level allowed the packaging of a large number of ICs on a single PCB with power distribution incorporated into one or more of the PCB planes.

More recently, advances in silicon fabrication techniques have permitted the manufacture of high performance IC packages with operating voltages at or below 1 volt and power levels in excess of 100 watts. As described in co-pending and commonly assigned U.S. patent application Ser. No. 09/785,892, METHOD AND APPARATUS FOR PROVIDING POWER TO A MICROPROCESSOR WITH INTEGRATED THERMAL AND EMI MANAGEMENT, by Joseph T. DiBene II et. al, filed Feb. 16, 2001, which application is hereby incorporated by reference, the transient current to some of these packages can approach hundreds of amps per microsecond. To assure optimum performance under these conditions, what is needed is a design which provides an electrical path from the power supply or voltage regulation module (VRM) to the IC that accommodates both high current flow and low series inductance, two goals are difficult to achieve at the same time.

The present invention achieves both of these goals, while also allowing for a compact, integrated stack-up system design that permits thermal dissipation and control of electromagnetic interference (EMI).

SUMMARY OF THE INVENTION

To address the requirements described above; the present invention discloses a method, apparatus, and article of manufacture, for providing power from a first circuit board to a second circuit board. The apparatus comprises a first conductive member, including a first conductive member first end and a first conductive member second end distal from the first end; a second conductive member disposed within the first conductive member, the second conductive member including a second conductor member first end and a second conductor member second end distal from the second conductor member first end; and one or more first circuit board permanent attachment features for electrical coupling with the first circuit board and second circuit board, and one or more disconnectable conduction features for electrically coupling the connector with the second circuit board. One of the advantages of the present invention is the integration of function in which the apparatus operates both as a rigid standoff to separate the first circuit board from the second circuit board, and a conduit for delivering power and a ground return between the circuit boards as well. While the apparatus will be discussed in terms of providing a power signal from a first circuit board to a second circuit board, it can also be used to provide power to a plurality of circuit boards in a stacked configuration, all with minimal interconnect impedance.

BRIEF DESCRIPTION OF THE DRAWINGS

Referring now to the drawings in which like reference numbers represent corresponding parts throughout.

DETAILED DESCRIPTION OF PREFERRED EMBODIMENTS

Figure 1A:
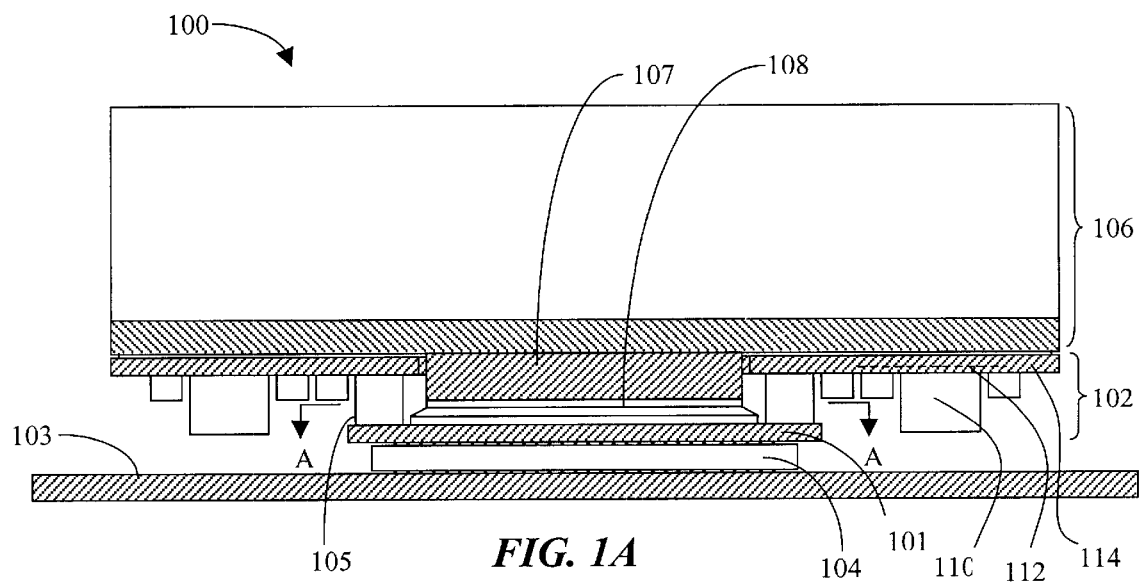
FIG. 1A is a two-dimensional section view illustrating an architecture in which the present invention may be usefully employed in delivering power to an electronic device such as a microprocessor.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention discloses a separable coaxial connector for providing power from a first circuit board to a second circuit board. In one embodiment, the apparatus comprises an inner cylindrical cylinder, an intermediate coaxially located insulator or dielectric material and an outer coaxially located cylindrical cylinder. The connector is disposed between a first planar structure or printed circuit board and a second planar structure or printed circuit board to provide a path for the transfer of electrical power and a ground return between the two planar structures in an efficient manner. This creates a very low impedance interconnect between power planes on the first planar structure and power planes on the second planar structure.

The present invention discloses a variety of methods in which the separable coaxial cylinders of the connector assembly may be joined to the upper and lower planar structures.

The present invention further describes a specific application where the separable coaxial connector assembly may be especially beneficial to delivering power to high performance microprocessor packages in such a manner as to negate the need to integrate power regulation circuitry directly onto the microprocessor package (hereinafter referred to as On-Package-Voltage-Regulation, OPVR), so as to improve the producibility, yield and cost of modern high performance microprocessors.

Encapsulated Circuit Assembly

Typically, a modern high performance microprocessor die is flip-chip attached to an organic or ceramic substrate utilizing a Controlled-Collapse-Chip-Connection (C4). The substrate has power planes which are used to distribute power to the chip connections. Often, the power requirements of the microprocessor exceed 100 watts at operating voltages of approximately 1 volt and transient current requirements in excess of 1000 amps per microsecond. Typically, power conditioning is required to transform system power (which is usually high voltage and low current) to lower voltages and higher current. Such power conditioning can be provided by a VRM. The stringent power demands require that the VRM be very closely coupled to the microprocessor or directly mounted onto the microprocessor substrate (the direct-mounting configuration is often called On-Package-Voltage-Regulation (OPVR)). OPVR architectures require combining VRM technology with high performance silicon technology all on a common substrate which is often very expensive because of the very large number of layers required to manage both the power and signal interconnect to the microprocessor die. The resulting assembly has reduced yield and higher costs than what might be achieved if the microprocessor function could be separated from the VRM function without reducing performance.

FIG. 1A is a diagram of a stack up assembly 100 illustrating the use of a coaxial connector assembly 105 used to deliver power to a microprocessor substrate 101 and its associated lid 108 from a remotely located VRM assembly 102. The VRM assembly 102 may include components 110 mounted on a VRM circuit board 114 and interconnected with other components on the circuit board 114 by circuit traces 112 in or on the circuit board 114. In the illustrated embodiment, the VRM assembly 102 surrounds the microprocessor lid 108, thus saving space in the z (vertical) axis.

The microprocessor lid 108 is thermally coupled to a heatsink structure 106 through a thermal coupling mesa 107 and appropriate thermal interface material (TIM) such as thermal grease (not shown) which can be integral to the base of 107 or a separate structure that is coupled (i.e. bonded, or metallically fused) to the base of the heatsink structure 106. Furthermore, heat generated from components in the VRM assembly 102 can be thermally attached directly to the base of heatsink assembly 106, thus sharing the heat dissipation benefits of the heatsink assembly 106. Signals from the microprocessor can be connected through pins (not shown) to socket 104 which is mounted to main board 103.

Power from the VRM assembly 102 is efficiently coupled to the microprocessor substrate 101 by utilizing one or more coaxial power connector assemblies 105. In one embodiment, four coaxial power connector assemblies 105 are used, and each is located proximate a corner of the microprocessor substrate 101.

Figure 1B:
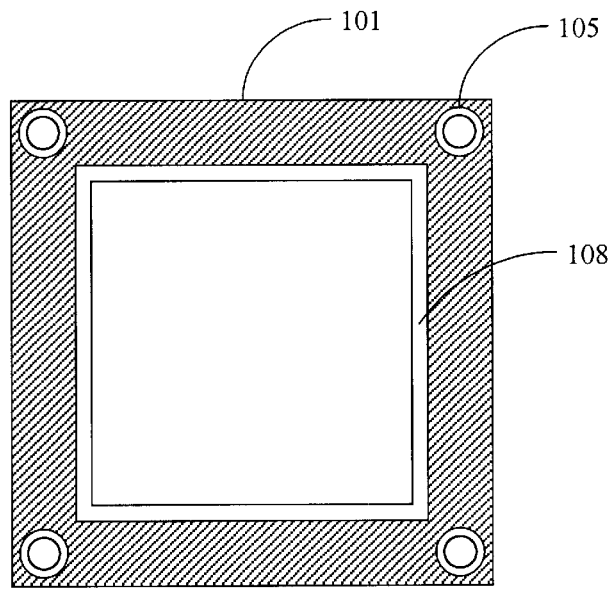
FIG. 1B is a section view of a microprocessor package used in FIG. 1A which further illustrates the location of the able power connectors associated with delivering power to the microprocessor shown if FIG. 1A.

FIG. 1B is a diagram showing the location of the four coaxial power connector assemblies 105 proximate the corners of the microprocessor substrate 105. The coaxial power connector assemblies 105 may be located in other locations on the substrate 101 such as at the center of each side. Further, the number of coaxial power connector assemblies 105 used can be varied to meet the power needs of target microprocessor or other high performance integrated circuit assemblies.

Coaxial Interconnect

Figure 2A:
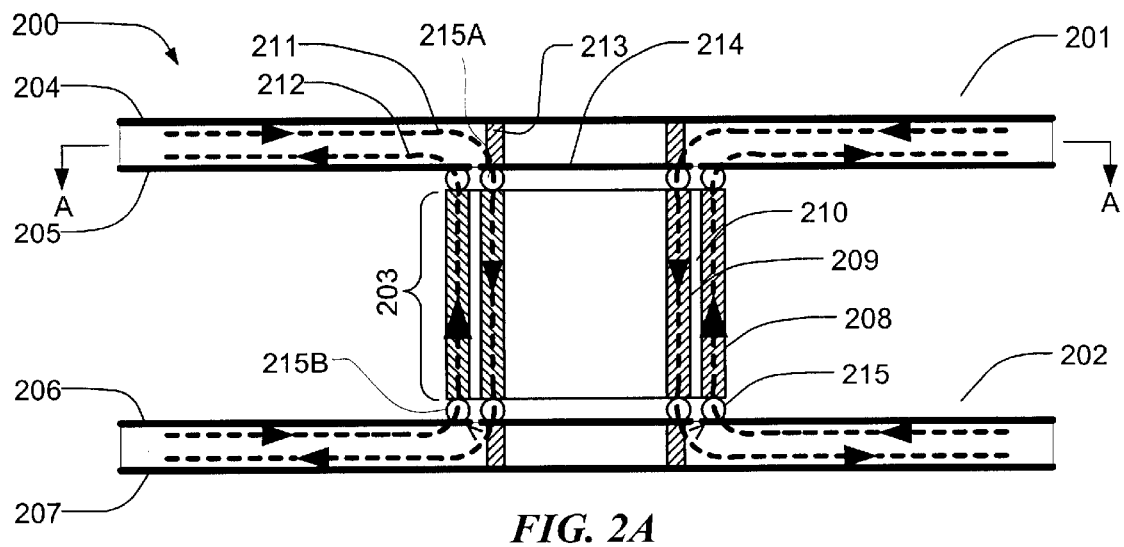
FIG. 2A is a two-dimensional section view of a conceptual coaxial interconnect illustrating the delivery of electrical energy from an upper planar circuit structure to a lower planar circuit structure.
Figure 2B:
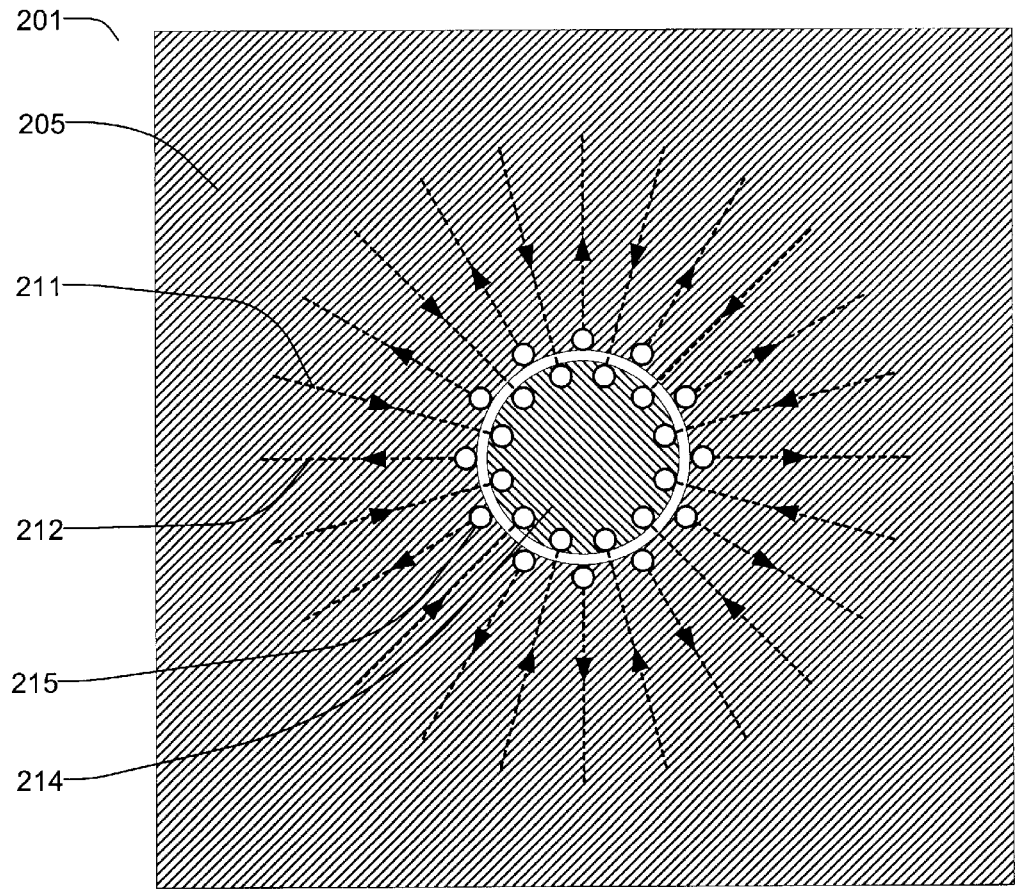
FIG. 2B is a two-dimensional plan view of the current flow to the coaxial interconnect structure in the upper planar circuit of FIG. 2A.

FIGS. 2A and 2B are diagrams illustrating a system for transfer of energy from a source (such as a VRM) on a first circuit board 201 to a second circuit board 202 through a coaxial power connector assembly 203.

A power signal 211 supplying current flows from the VRM on the first circuit board 201 (hereinafter alternatively referred to as first PCB) through a conductive plane 204 in or on the first circuit board 201 through plated-through-holes (PTHs) 213 to an isolated surface pad 214 on the bottom surface of first circuit board 201 thence through interface connection 215A to coaxial power connector assembly 203. The power signal then passes through the first conductive member 209 to similar connections on the second circuit board 202 and then onto conductive plane 207 in or on the second circuit board 202, and thence to the load (e.g. the IC or microprocessor). A ground return signal 212 passes from a ground plane 206 in or on the second circuit board 202 through interface connection 215B to a second conductive member 208, through the second conductive member 208, through interface connection 215 and, finally, to conductive plane 205 on or in the first circuit board 201. This acts as a ground return for the VRM power signal. The space between the first conductive member 209 and the second conductive member 208 may include a dielectric or electric insulator 210, if desired.

The interface connections 215 represent an electromechanical connection between the coaxial cylinders 208 and 209 and the circuit board features 205, 206 and 214. These connections may be a continuous interface such as may occur if the coaxial cylinders were to be soldered or pressed directly onto the conductive planes of board 201 and 202. However, there may be instances where discrete or separate connections to the boards 201 and 202 may be desirable. Such would be the case if the connections were spring fingers or formed leads on one or both of the cylinders 208 and 209. When discrete connections are utilized it is important that such connections be placed uniformly around the circumference of the cylinders so that the current flows substantially equally through the walls of the coaxial cylinders. When both cylinders utilize discrete connections then it is very desirable that these connections be alternated (one polarity being disposed adjacent another polarity on both sides) in an interdigitated fashion to achieve the lowest interconnect inductance from the planes of the boards 201 and 202 and the cylinders 208 and 209 of coaxial connector assembly 203. FIG. 2B illustrates such an arrangement where the interface connections 215 are arranged in a uniform manner around the perimeters of the coaxial cylinders. Then, source current 211 and sink current 212 are meant to illustrate a substantially uniform current distribution into and out of the cylinders.

In a preferred embodiment, the second conductive member 208 is hollow and the first conductive member 209 is disposed within the second conductive member 208 such that they are substantially coaxial (e.g. the major axis of the first conductive member and the major axis of the second conductive member are co-linear). In this embodiment, the series inductance of the coaxial power connector assembly 203 is governed primarily by the basic equation:

$$L_{COAX} = \frac{\mu_0 h}{2\pi} \ln(D_O / D_I)$$

where $\mu_0$ is the permeability of space, h is the length of the power connector 203 body, $D_O$ is the inner diameter of the outer conductor, and $D_I$ is the diameter of the inner conductor. As the diameters get closer to each other the natural log function approaches zero. This is the theoretical limit the inductance may achieve with such a construction. Practical issues limit achieving this limit however with such a construction the actual inductance achieved may be very low.

The reason for reducing the interconnection inductance is that the voltage drop across the interconnect is crucial for proper operation. As stated previously, high current slew-rates can create large drops across an inductive interconnect. This may be seen by the simple equation for the dynamic voltage drop across an interconnect:

$$\Delta V \cong I_{STEP} R_{AC} + L_{TOT} \frac{dI}{dt}$$

Where $I_{STEP}$ is the step current the IC creates when switching transistors internally, $R_{AC}$ is the AC resistance of the interconnect, $L_{TOT}$ is the total inductance of the interconnect, and dI/dt is the rate of change or AC current slew-rate which occurs due to the switching transistors. Often the inductance is the dominant element in the path and thus contributes to the largest portion of the drop across the interconnect.

Separable Coaxial Connector Embodiments

Figure 3A:
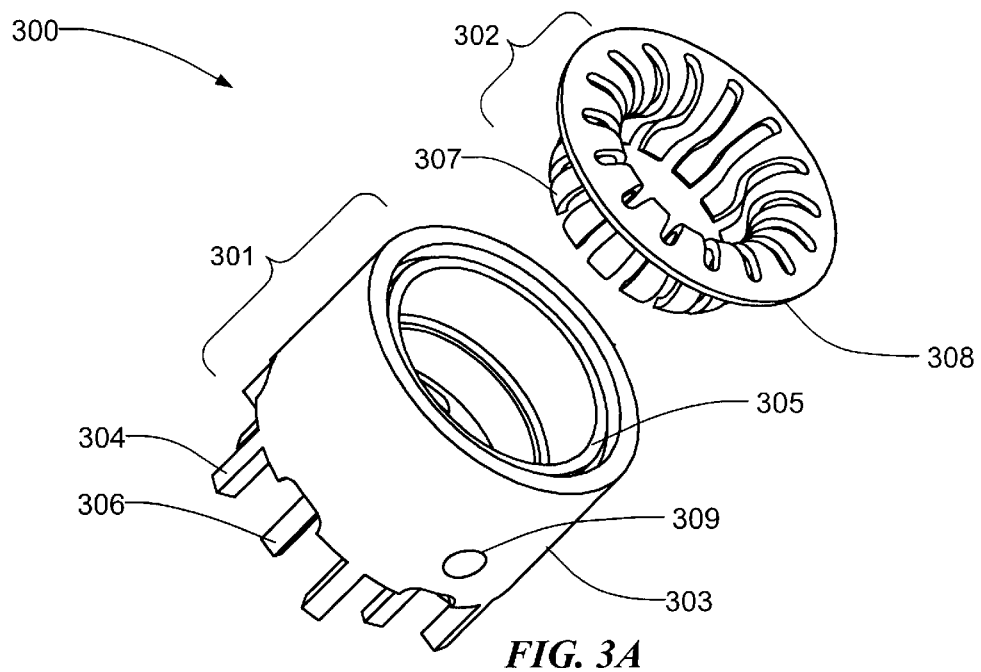
FIG. 3A is an exploded isometric view of a coaxial power connection method utilizing an inner diameter contact washer as a method of connecting the inner cylinder of the connector to a flexible PCB.

FIG. 3A is a diagram illustrating a preferred embodiment of a coaxial power connector assembly 300. The coaxial power connector assembly 300 is used to route power from a first circuit board to a second circuit board. In the illustrated embodiment the lower coaxial assembly 301 comprises a first conductive member such as an outer coaxial cylinder 303 and a second conductive member such as an inner coaxial cylinder 305. The outer coaxial cylinder 303 comprises first circuit board permanent attachment features such as lead extensions 304. In a preferred embodiment, the lead extensions 304 can be integrated with the outer coaxial cylinder 303, but this need not be the case. The lead extensions 304 electrically couple the outer cylinder to a first circuit board first power polarity, while the inner coaxial cylinder 305 with lead extensions 306 electrically couple the inner coaxial cylinder 305 to a first circuit board 315 second power polarity. Electrical coupling of the outer coaxial cylinder 303 to a second circuit board first power polarity contact pad is accomplished by direct contact of the top end of the outer cylinder 303 to a first power polarity contact pad area on the second circuit board.

Disconnectable conduction features such as those on the Inner Diameter Contact Washer (IDCW) 302 are used to electrically connect the inner coaxial cylinder 302 to a second circuit board second power polarity contact pad area utilizing spring contacts 307. The spring contacts 307 engage the inner diameter of the inner coaxial cylinder 305 and second surface 308 which engages a conductive surface (i.e. a second power polarity contact pad) on the second circuit board. In the illustrated embodiment, the IDCW is removably insertable into the inner diameter of the inner coaxial cylinder 305 so that the contacts 307 press against the inner coaxial cylinder inner surface.

Side hole 309 in outer coaxial cylinder 303 is used to provide egress for dispensing insulating material between the outer coaxial cylinder 303 and the inner coaxial cylinder 305 and may be used for registering the inner and outer shells to each other by placing holes in both the inner and outer shells and allowing material to flow into these holes thereby creating an alignment joint. This may also be accomplished by placing an insulating alignment pin into holes co-located with each other along the alignment pin axis.

Figure 3B:
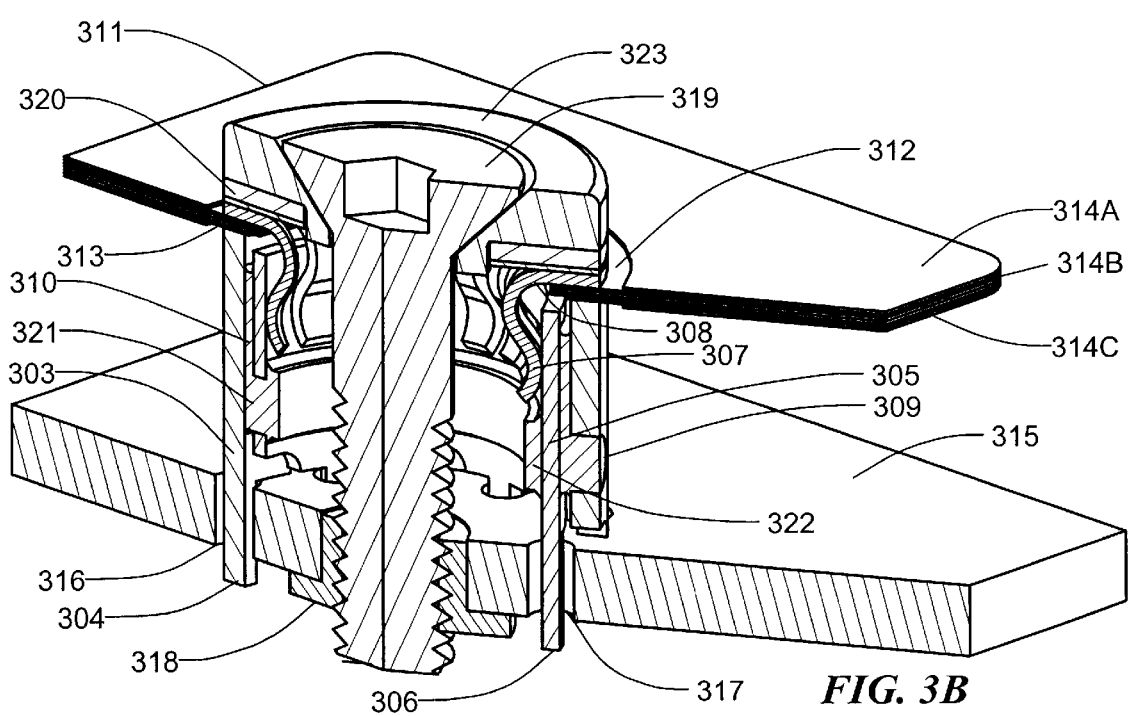
FIG. 3B is an isometric section view of the structure shown in FIG. 3A together with an upper flexible PCB, a lower rigid PCB and the associated fasteners and assembly washers.

FIG. 3B is a diagram revealing a more complete arrangement of the coaxial power connector assembly 300 when used to route power between two circuit boards. In the illustrated embodiment lower coaxial assembly 301 is permanently attached to first circuit board 315 by solder methods utilizing plated thru holes (PTH) and circuit pads 316 and 317. Outer coaxial cylinder lead extensions 304 engage with PTHs 316 which are connected to the first power polarity circuit of first circuit board 315. Inner coaxial cylinder lead extensions 306 engage with PTHs 317 which are connected to the second power polarity circuit of first circuit board 315. Second circuit board 311 is shown as a flexible printed circuit board assembly consisting of at least two conductive planes 312 and 313. The lower plane 313 forms the first power polarity circuit in the second PCB 311 while the upper plane 312 forms the second power polarity circuit in the second PCB 311. The two planes are insulated from one another using a polyimide material 314B or other suitable electrical dielectric and their outer surfaces are protected from external damage by the use of an upper and lower cover layer 314A and 314C, respectively, also made of polyimide material or other suitable electrical dielectric. Note that power planes 312 and 313 are provided with a hole to allow the passage of IDCW 302 to pass through. Also note that cover layers 314A and 314C have been removed in the area proximate the coaxial cylinders so as to expose the power planes 312 and 313. Thus, as can be seen, upper portion of outer coaxial cylinder 303 is urged against second circuit board 311 first power polarity plane 313 creating a contact pad area to the plane at this junction. Next, lower surface 308 of IDCW 302 is urged against second power polarity plane 312 of second circuit board 311. A normal force applied to IDCW 302 causes the spring contacts 307 to be forced outward which, in turn, creates a contact to occur to the surface of the inner diameter of the inner coaxial cylinder 305. The required normal force which is applied substantially equally to both IDCW 302 in the area of lower surface 308 and the contact end of outer coaxial cylinder 303 is applied through screw fastener 319, washers 320 and 323, and captive nut 318 in PCB 315 which, collectively, provide the necessary normal force to urge IDCW 302 against second power polarity plane 312 and upper portion of outer coaxial cylinder 303 against first power polarity plane 313. Outer coaxial cylinder 303 is maintained separated from inner coaxial cylinder 305 by dielectric insulator 310. One method of fabricating such an insulator is to position the inner and outer cylinders 305 and 303 in a fixture and inject a thermoplastic material through access hole 309. The thermoplastic material can be made to flow through to a second hole 321 in the inner coaxial cylinder 305 which can form a secondary feature 322 within the inner diameter of the inner coaxial cylinder 305. It should be noted that such secondary feature 322 is not necessary for functionality of assembly 300 and may be useful only as a means of optimizing the manufacture of the dielectric feature 310. Furthermore, other methods of fabricating the coaxial structure 300 are possible.

Figure 4A:
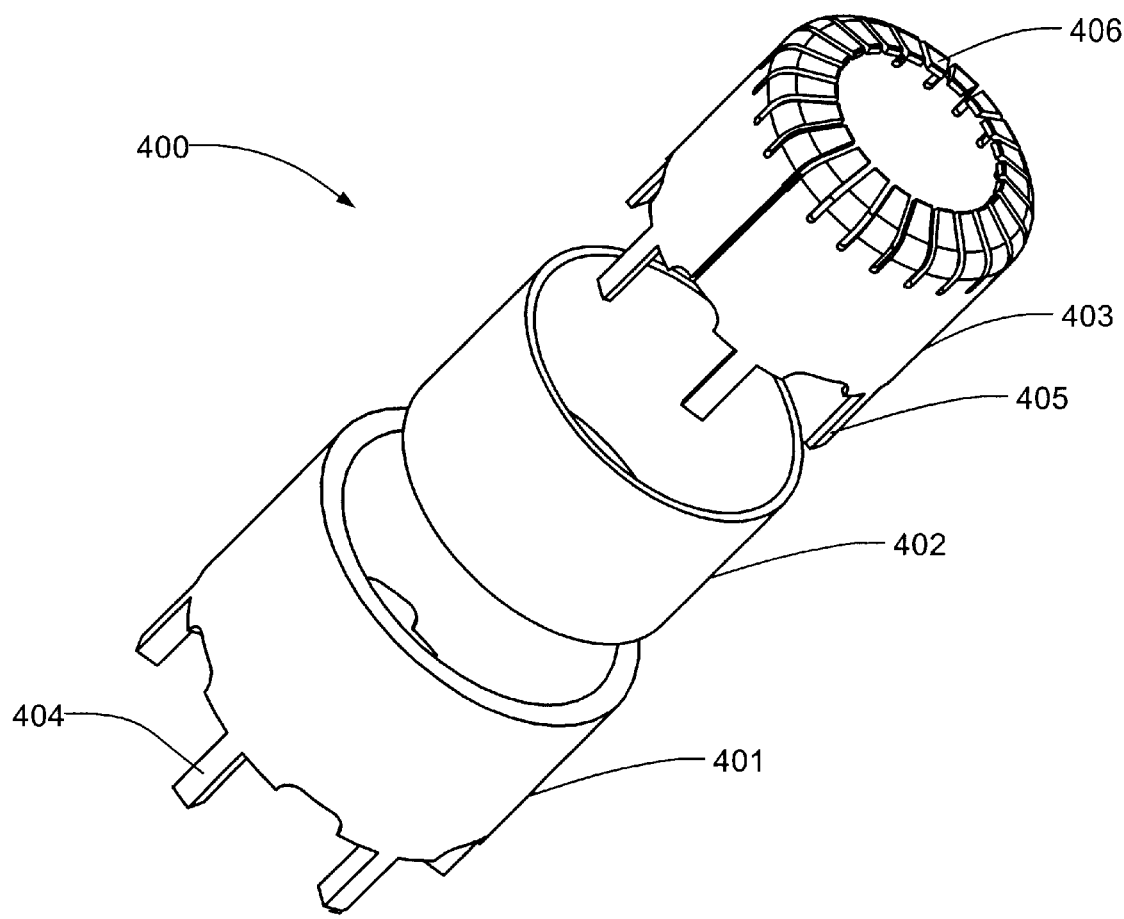
FIG. 4A is an exploded isometric view of a coaxial power connector illustrating the outer shell, dielectric insulator and inner shell.
Figure 4B:
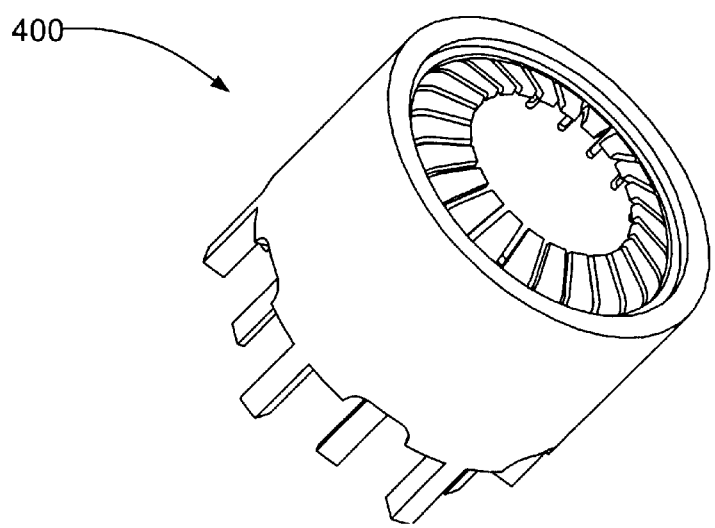
FIG. 4B is an isometric view of the assembled coaxial power connector illustrated in FIG. 4A.

FIG. 4A is a diagram of another embodiment of a coaxial power connector assembly 400. In this embodiment the outer coaxial cylinder 401 is similar to outer cylinder 303 with lead extensions 404 used to electrically couple the outer cylinder 401 to a first circuit board first power polarity (e.g. a circuit connector or trace in or on the first circuit board having a first power polarity or ground) and an inner coaxial cylinder 403 with lead extensions 405 used to electrically couple the inner cylinder 403 to a first circuit board second power polarity (e.g. a circuit connector or trace on or in the second circuit board having a second polarity or ground). Electrical coupling of the outer coaxial cylinder 401 to a second circuit board first power polarity contact pad is accomplished by direct contact of the end 450 of the outer cylinder 401 to a first power polarity contact pad area on the second circuit board. Integral spring contact features 406 on inner coaxial cylinder 403 are used to electrically connect a second circuit board second power polarity contact pad area. Dielectric insulating sleeve 402 provides separation of inner and outer coaxial cylinders 401 and 403. FIG. 4B illustrates assembly 400 in an assembled state.

Figure 4C:
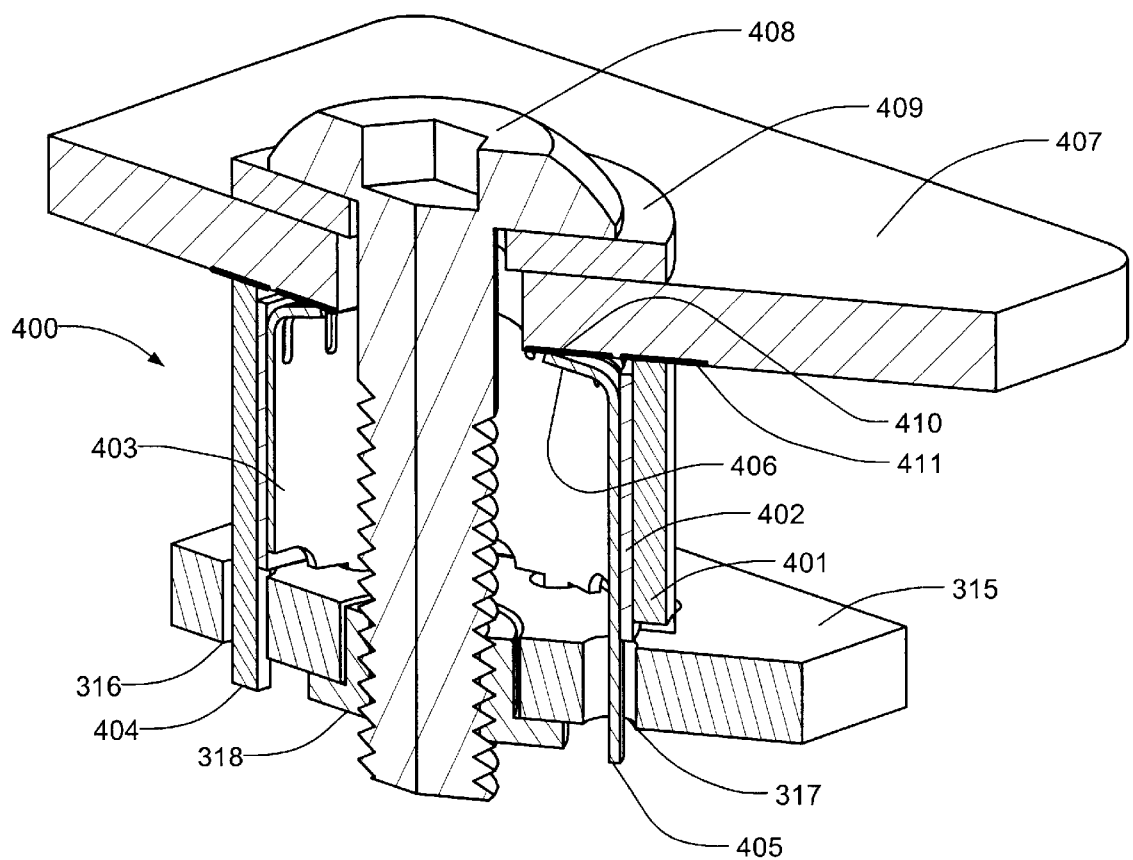
FIG. 4C is an isometric section view of the structure shown in FIGS. 4A and 4B together with an upper PCB, a lower PCB and the associated fastener and assembly washers.

FIG. 4C is a diagram revealing a more complete arrangement of the coaxial power connector assembly 400 when used to route power between two circuit boards. In the illustrated embodiment coaxial assembly 400 is permanently attached to first circuit board 315 by soldering methods utilizing plated thru holes and circuit pads 316 and 317. Outer coaxial cylinder lead extensions 404 engage with PTHs 316 which are connected to the first power polarity circuit of first circuit board 315. Similarly, inner coaxial cylinder lead extensions 405 engage with PTHs 317 which are connected to the second power polarity circuit of first circuit board 315. Upper portion of outer coaxial cylinder 401 is urged against pad 411 which is connected to first power polarity of second circuit board 407. Spring contacts 406 on inner coaxial cylinder 403 are urged against pad 410 which is connected to second power polarity of second circuit board 407, thus, completing the power circuit from first circuit board 315 to second circuit board 407. Screw fastener 408 and washer 409 are used to mechanically couple the second circuit board 407 to the first circuit board 315 through captive nut 318 in PCB 315. Note that spring contact 406 permits variations in height differences between the inner coaxial cylinder 403 and outer coaxial cylinder 401 to be accommodated while maintaining controlled forces at both separable contact points on pads 410 and 411. If this were not the case and both cylinders were to simply be allowed to butt up against the contact pads small differences in cylinder heights could easily result in the shorter cylinder having an unreliable contact at its corresponding pad on PCB 407.

Figure 5A:
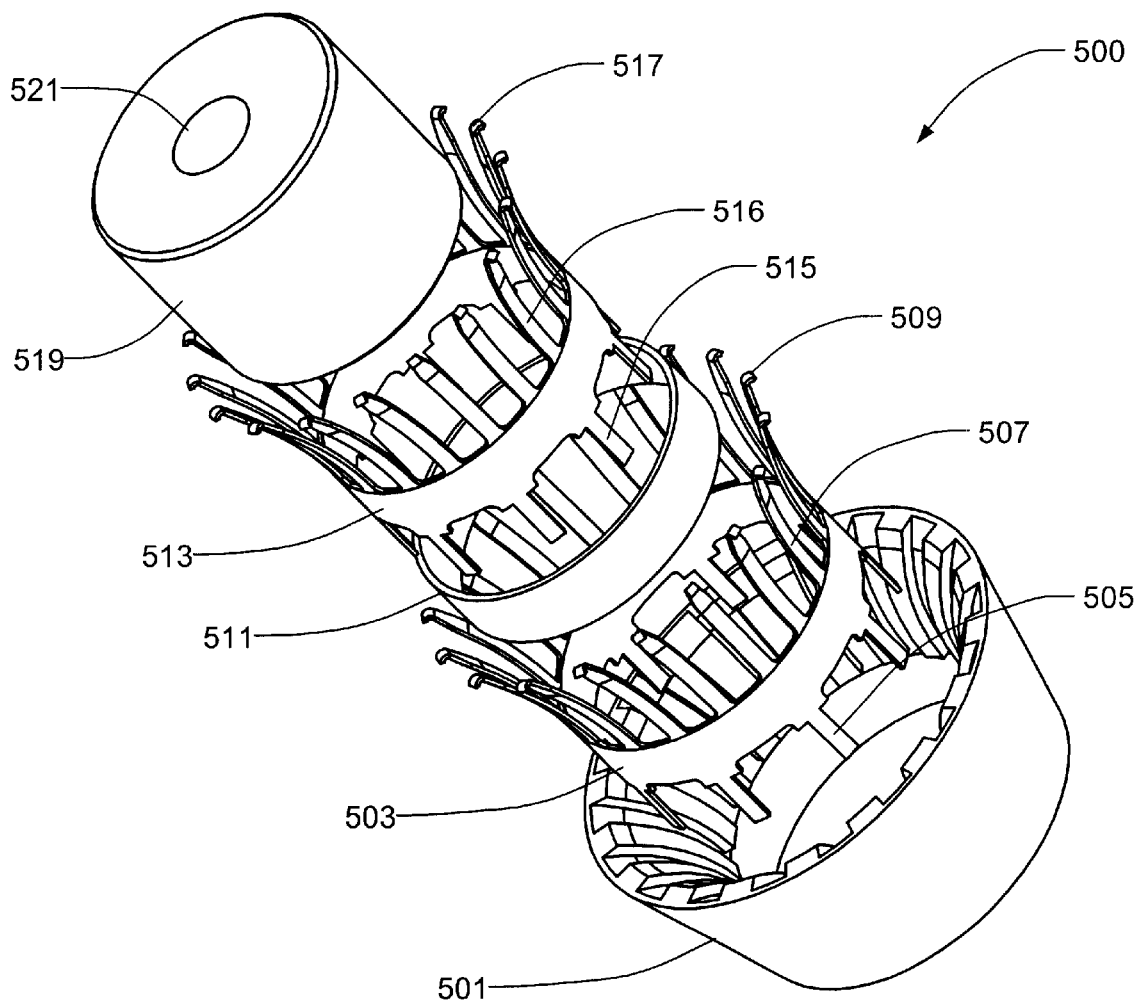
FIG. 5A is an exploded isometric view of a coaxial power connection method utilizing dual interdigitated spring finger contacts which are a part of the inner and outer cylinders and are used as a method of connecting the inner and outer cylinders of the connector to a PCB.
Figure 5B:
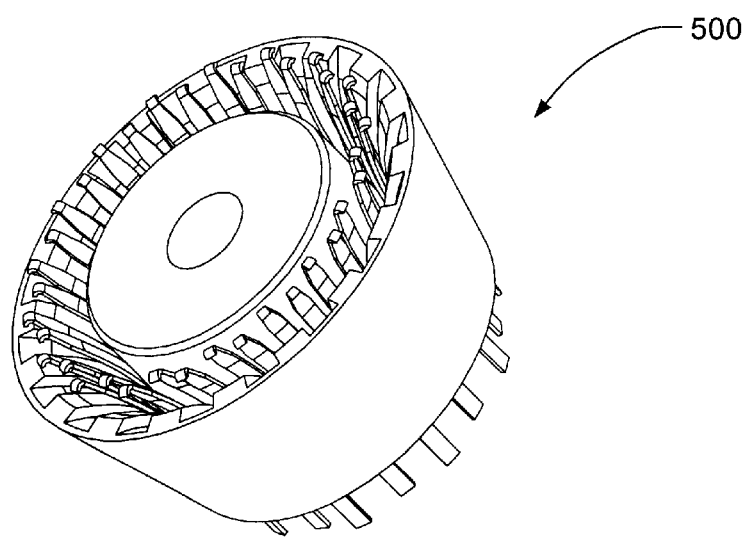
FIG. 5B is an isometric view of the assembled coaxial power connector illustrated in FIG. 5A.

FIG. 5A is an exploded view of a coaxial connector 500 where both the inner and outer conductive cylinders utilize spring contacts to engage a second circuit board with a separable connection. In this embodiment, the outer coaxial cylinder 503 has lead extensions 505 used to electrically couple the outer cylinder 503 to a first circuit board first power polarity, and spring extensions 507 having contact areas 509 located at the opposite end of the spring extension 507 are used to establish a compliant and separable contact to second circuit board first power polarity via contact pads on the second circuit board. Similarly, inner coaxial cylinder 513 has lead extensions 515 used to couple electrically the inner cylinder to a first circuit board second power polarity and spring extensions 516 with contact area 517 located at the end of the spring extension 516 used to establish a second compliant and separable contact to a second circuit board second power polarity again utilizing contact pads on second circuit board. Dielectric insulting sleeve 511 provides separation and electrical isolation of inner 513 and outer 503 coaxial cylinders 503 and 513. Shroud 501 is used to provide support for spring extensions 507 and 516 when the assembly is compressed between the first and second circuit boards. Additionally, shroud 501 protects the contact ends 509 and 517 from damage prior to installation of the assembly. Insulating standoff 519 is located within the inner coaxial cylinder 513 and is used to provide a limit stop on the 'z' axis separation between a first circuit board and second circuit board. Hole 521 in standoff 519 is used to accommodate a fastener which is used to join the two circuit boards and the coaxial connector 500. FIG. 5B illustrates assembly 500 when assembled.

Figure 5C:
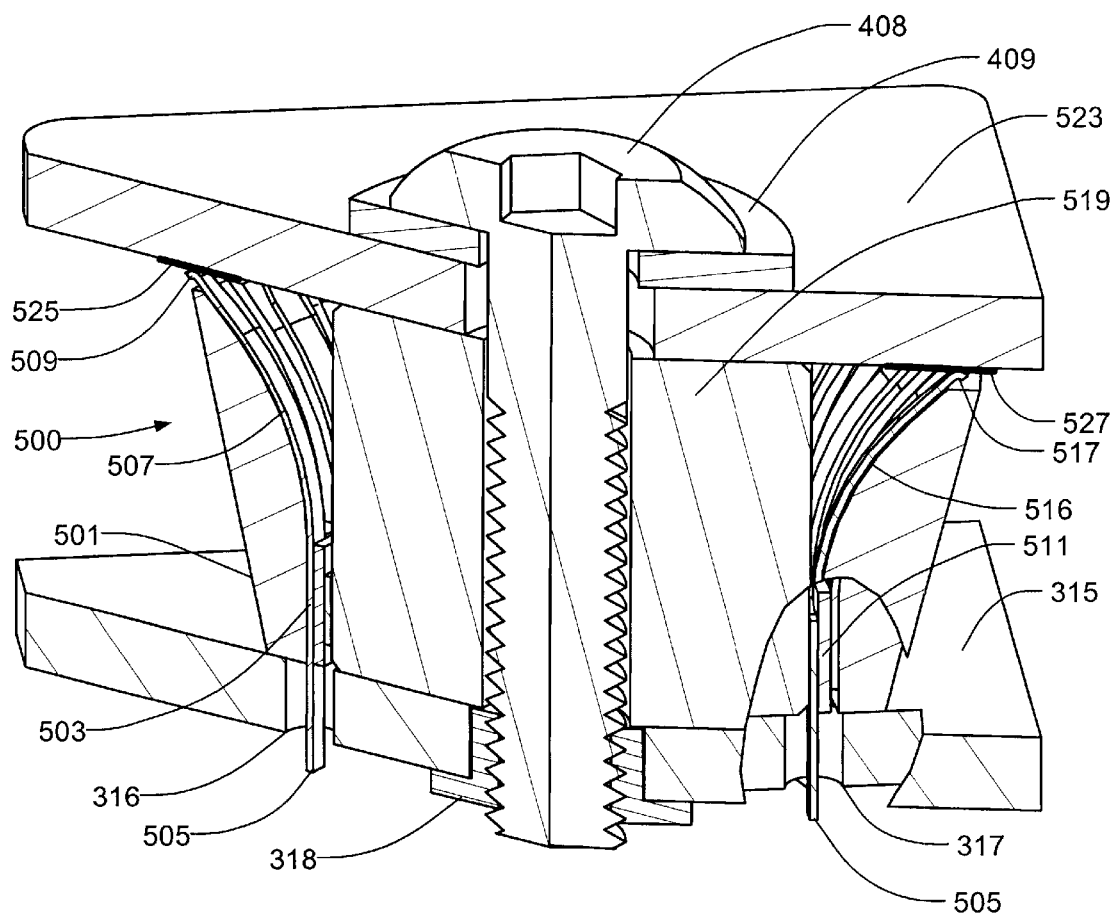
FIG. 5C is an isometric section view of the structure shown in FIGS. 5A and 5B together with an upper PCB, a lower PCB and the associated fastener and assembly washer.

FIG. 5C is a diagram revealing a more complete arrangement of the coaxial power connector assembly 500 when used to route power between two circuit boards. In the illustrated embodiment coaxial assembly 500 is permanently attached to first circuit board 315 by soldering methods utilizing plated thru holes and circuit pads 316 and 317. Outer coaxial cylinder lead extensions 505 engage with PTHs 316 which are connected to the first power polarity circuit of first circuit board 315. Similarly, inner coaxial cylinder lead extensions 505 engage with PTHs 317 which are connected to the second power polarity circuit of first circuit board 315. Contacts 525 which are an extension of the body of outer cylinder 503 through spring 507 are urged against pads 525 which are connected to first power polarity of second circuit board 523. Similarly, contacts 517 which are an extension of the body of inner cylinder 511 through springs 516 are urged against pads 527 which are connected to second power polarity of second circuit board 523. Note that termini of the spring contacts 509 and 517 share an approximate common diametrical circle and, thus, the contact pads 525 and 527 on the second circuit board 523 must alternate between the first power polarity and the second power polarity. This arrangement referred to as an interdigitated connection is very beneficial in reducing the interconnection inductance of the power circuit. Screw fastener 408 and washer 409 are used to mechanically couple the second circuit board 523 to the first circuit board 315 through captive nut 318 in PCB 315. Spacer 519 establishes a precise separation 'z' axis between PCBs 523 and 315 which results in controlled contact forces at pads 525 and 527. As previously noted, shroud 501 helps support spring extensions 507 and 516 when PCBs 523 and 315 are urged together.

Conclusion

This concludes the description of the preferred embodiments of the present invention. In summary, the present invention describes a method, apparatus, and article of manufacture for providing power from a first circuit board to a second circuit board. The apparatus comprises a first conductive member, including a first conductive member first end and a first conductive member second end distal from the first end; a second conductive member disposed within the first conductive member, the second conductive member including a second conductor member first end and a second conductor member second end distal from the second conductor member first end; and one or more first circuit board permanent attachment features for electrical coupling with the first circuit board and second circuit board, and one or more disconnectable conduction features for electrically coupling the connector with the second circuit board. One of the advantages of the present invention is the integration of function in which the apparatus operates both as a rigid standoff to separate the first circuit board from the second circuit board, and a conduit for delivering power and a ground return between the circuit boards as well. While the apparatus will be discussed in terms of providing a power signal from a first circuit board to a second circuit board, it can also be used to provide power to a plurality of circuit boards in a stacked configuration, all with minimal interconnect impedance.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A connector, for providing power and ground between a first circuit board and a second circuit board, comprising:
    a cylindrical first conductive member, including a first conductive member first end and a first conductive member second end distal from the first end;
    a cylindrical second conductive member coaxially disposed within the first conductive member, the second conductive member including a second conductor member first end and a second conductor member second end distal from the second conductor member first end;
    a first permanent attachment feature disposed at the first conductive member first end and electrically coupling the first conductive member with the first circuit board;
    a second permanent attachment feature disposed at the second conductive member first end and electrically coupling the second conductive member with the first circuit board;
    a plurality of first spring extensions disposed at the first conductive member second end and electrically coupling the first conductive member with the second circuit board, wherein a first electrical connection between the first and second circuit boards is formed;
    a plurality of second spring extensions disposed at the second conductive member second end and electrically coupling the second conductive member with the second circuit board, wherein a second electrical connection between the first and second circuit boards is formed, and wherein the first electrical connection is electrically isolated from the second electrical connection; and
    a dielectric insulator interposed between the first conductive member and the second conductive member.

2. The connector of claim 1, wherein:
    the first permanent attachment feature comprises a lead extension.

3. The connector of claim 2, wherein the lead extension is integrated with the first conductive member first end.

4. The connector of claim 2, wherein the lead extension is disposed in holes in the first circuit board.

5. The connector of claim 2, wherein the lead extension is disposed substantially in a z axis normal to the first circuit board.

6. The connector of claim 1, wherein at least one of the plurality of first spring extensions comprise a surface parallel to and electrically coupling with a conductive surface of the second circuit board.

7. The connector of claim 6, wherein the conductive surface of the second circuit board is disposed on a bottom side of the second circuit board.

8. The connector of claim 1, wherein the plurality of first spring extensions is interdigitated with the plurality of second spring extensions.

9. The connector of claim 8, wherein the plurality of first spring extensions is alternatively interdigitated with the plurality of second spring extensions.

10. The connector of claim 8, further comprising a shroud, substantially surrounding the first conductive member.

11. The connector of claim 1, wherein the plurality of first spring extensions and the plurality of second spring extensions are compressible in a z-axis normal to the first circuit board and the second circuit board and accommodate differences between a length of the first conductive member and the second conductive member.

12. The connector of claim 11, wherein the first conductive member is shorter than the second conductive member.

13. The connector of claims 11, further comprising a standoff disposed within the second conductive member.

14. The connector of claim 1, further comprising a fastener disposed through the second conductive member, the fastener urging the first and the second circuit boards together.

15. The connector of claim 1, wherein the first circuit board comprises a voltage regulator module.

16. The connector of claim 1, wherein the first circuit board comprises a power supply.

17. The connector of claim 1, wherein the first circuit board comprises an integrated circuit.

18. The connector of claim 17, wherein the integrated circuit is a microprocessor.

19. The connector of claim 1, wherein the second circuit board comprises a voltage regulator module.

20. The connector of claim 1, wherein the second circuit board comprises a power supply.

21. The connector of claim 1, wherein the second circuit board comprises an integrated circuit.

22. The connector of claim 21, wherein the integrated circuit is a microprocessor.

23. A connector, for providing power and ground between a first circuit board and a second circuit board, comprising:
   a first conductive member including
      a first permanent attachment feature electrically coupling the first conductive member with the first circuit board, and
      a plurality of first spring extensions electrically coupling the first conductive member with the second circuit board, the plurality of first spring extensions being distal from the permanent attachment feature, and the first conductive member forming a first electrical connection between the first and second circuit boards;
   a second conductive member disposed coaxially within the first conductive member and including
      a second permanent attachment feature electrically coupling the second conductive member with the first circuit board, and
      a plurality of second spring extensions electrically coupling the second conductive member with the second circuit board, the plurality of second spring extensions being arranged within an inner diameter of the plurality of first spring extensions, the second conductive member forming a second electrical connection between the first and second circuit boards, and the second electrical connection being electrically isolated from the first electrical connection; and
   a dielectric insulator interposed between the first conductive member and the second conductive member.

24. The connector of claim 23, wherein the first permanent attachment feature comprises a lead extension.

25. The connector of claim 24, wherein the lead extension is disposed in holes in the first circuit board.

26. The connector of claim 24, wherein the lead extension is disposed substantially in a z axis normal to the first circuit board.

27. The connector of claim 23, wherein at least one of the plurality of first spring extensions comprise a surface parallel to and electrically coupling with a conductive surface of the second circuit board.

28. The connector of claim 27, wherein the conductive surface of the second circuit board is disposed on a bottom side of the second circuit board.

29. The connector of claim 23, wherein the plurality of first spring extensions is interdigitated with the plurality of second spring extensions.

30. The connector of claim 29, wherein the plurality of first spring extensions is alternatively interdigitated with the plurality of second spring extensions.

31. The connector of claim 29, further comprising a shroud, substantially surrounding the first conductive member.

32. The connector of claim 23, wherein the plurality of first spring extensions and the plurality of second spring extensions are compressible in a z-axis normal to the first circuit board and the second circuit board and accommodate differences between a length of the first conductive member and the second conductive member.

33. The connector of claim 32, wherein the first conductive member is shorter than the second conductive member.

34. The connector of claims 32, further comprising a standoff disposed within the second conductive member.

35. The connector of claim 23, further comprising a fastener disposed through the second conductive member, the fastener urging the first and the second circuit boards together.

36. The connector of claim 23, wherein the first circuit board comprises a voltage regulator module.

37. The connector of claim 23, wherein the first circuit board comprises a power supply.

38. The connector of claim 23, wherein the first circuit board comprises an integrated circuit.

39. The connector of claim 38, wherein the integrated circuit is a coprocessor.

40. The connector of claim 23, wherein the second circuit board comprises a voltage regulator module.

41. The connector of claim 23, wherein the second circuit board comprises a power supply.

42. The connector of claim 23, wherein the second circuit board comprises an integrated circuit.

43. The connector of claim 42, wherein the integrated circuit is a microprocessor.

44. A connector, for providing power and ground between a first circuit board and a second circuit board, comprising:
   a first conductive member including
      a first permanent attachment feature electrically coupling the first conductive member with the first circuit board, and
      a plurality of first spring extensions electrically coupling the first conductive member with the second circuit board, the plurality of first spring extensions being distal from the permanent attachment feature, and the first conductive member forming a first electrical connection between the first and second circuit boards;
   a second conductive member disposed coaxially within the first conductive member and including
      a second permanent attachment feature electrically coupling the second conductive member with the first circuit board, and
      a plurality of second spring extensions electrically coupling the second conductive member with the second circuit board, the second conductive member forming a second electrical connection between the first and second circuit boards, and the second electrical connection being electrically isolated from the first electrical connection;
   a dielectric insulator interposed between the first conductive member and the second conductive member; and
   a shroud substantially surrounding the first conductive member and providing support to the plurality of first spring extensions and the plurality of second spring extensions when the first circuit board is urged against the second circuit board.

45. The connector of claim 44, wherein the first permanent attachment feature comprises a lead extension.

46. The connector of claim 45, wherein the lead extension is disposed in holes in the first circuit board.

47. The connector of claim 45, wherein the lead extension is disposed substantially in a z axis normal to the first circuit board.

48. The connector of claim 44, wherein at least one of the plurality of first spring extensions comprise a surface parallel to and electrically coupling with a conductive surface of the second circuit board.

49. The connector of claim 48, wherein the conductive surface of the second circuit board is disposed on a bottom side of the second circuit board.

50. The connector of claim 44, wherein the plurality of first spring extensions is interdigitated with the plurality of second spring extensions.

51. The connector of claim 50, wherein the plurality of first spring extensions is alternatively interdigitated with the plurality of second spring extensions.

52. The connector of claim 44, wherein the plurality of first spring extensions and the plurality of second spring extensions are compressible in a z-axis normal to the first circuit board and the second circuit board and accommodate differences between a length of the first conductive member and the second conductive member.

53. The connector of claim 52, wherein the first conductive member is shorter than the second conductive member.

54. The connector of claims 52, further comprising a standoff disposed within the second conductive member.

55. The connector of claim 44, further comprising a fastener disposed through the second conductive member, the fastener urging the first and the second circuit boards together.

56. The connector of claim 44, wherein the first circuit board comprises a voltage regulator module.

57. The connector of claim 44, wherein the first circuit board comprises a power supply.

58. The connector of claim 44, wherein the first circuit board comprises an integrated circuit.

59. The connector of claim 58, wherein the integrated circuit is a microprocessor.

60. The connector of claim 44, wherein the second circuit board comprises a voltage regulator module.

61. The connector of claim 44, wherein the second circuit board comprises a power supply.

62. The connector of claim 44, wherein the second circuit board comprises an integrated circuit.

63. The connector of claim 62, wherein the integrated circuit is a microprocessor.

* * * * *